United States Patent [19]

Hasegawa et al.

[11] Patent Number: 5,498,878
[45] Date of Patent: Mar. 12, 1996

[54] METHOD AND APPARATUS FOR DETECTING POSITIONAL DEVIATION BY USING DIFFRACTION GRATINGS WITH A COMPENSATION DELAY DETERMINING UNIT

[75] Inventors: Noriyasu Hasegawa, Utsunomiya; Tetsuzo Mori, Atsugi, both of Japan

[73] Assignee: Canon Kabushiki Kaisha, Tokyo, Japan

[21] Appl. No.: 353,236

[22] Filed: Dec. 2, 1994

[30] Foreign Application Priority Data

Dec. 3, 1993 [JP] Japan .................................. 5-339344

[51] Int. Cl.⁶ .............................................. G01N 21/86
[52] U.S. Cl. ................................... 250/548; 356/356
[58] Field of Search ............................ 250/548, 559.26, 250/559.3, 559.37; 356/356, 363, 401, 349

[56] References Cited

U.S. PATENT DOCUMENTS

| | | | |
|---|---|---|---|
| 4,710,026 | 12/1987 | Magome et al. | 356/356 |
| 5,070,250 | 12/1991 | Komatsu et al. | 356/363 |
| 5,268,744 | 12/1993 | Mori et al. | 356/400 |
| 5,309,197 | 5/1994 | Mori et al. | 356/400 |
| 5,333,050 | 7/1995 | Nose et al. | 356/356 |
| 5,432,603 | 7/1995 | Sentoku et al. | 356/349 |

FOREIGN PATENT DOCUMENTS

62-56818  3/1987  Japan .

Primary Examiner—Edward P. Westin
Assistant Examiner—Que T. Le
Attorney, Agent, or Firm—Fitzpatrick, Cella Harper & Scinto

[57] ABSTRACT

A method and apparatus for measuring relative positional deviation between first and second diffraction gratings formed on an object is disclosed, wherein, in detection of a signal corresponding to the relative positional deviation between the first and second diffraction gratings, a suitable delay is determined in accordance with a signal corresponding to a relative positional deviation between third and fourth diffraction gratings formed on the object and having a predetected relative positional deviation, and wherein the measurement of the positional deviation between the first and second diffraction grating is done on the basis of a signal corresponding to that deviation and of the delay thus determined.

8 Claims, 6 Drawing Sheets

METHOD AND APPARATUS FOR DETECTING POSITIONAL DEVIATION BY USING DIFFRACTION GRATINGS WITH A COMPENSATION DELAY DETERMINING UNIT

FIELD OF THE INVENTION AND RELATED ART

This invention relates generally to a method and apparatus for measuring positional deviation. More particularly, the invention is concerned with a positional deviation measuring method and apparatus suitably usable, for example, in a semiconductor device manufacturing exposure apparatus for superposedly printing, by exposure, a fine pattern of a first object (such as an integrated circuit pattern formed on a mark or reticle) on a second object (such as a wafer) having a similar pattern or patterns, for measuring registration precision between the mask or reticle pattern and the wafer pattern.

As for the method of measuring such registration precision (positional deviation precision), known examples are: a method in which mutual deviation of printed patterns, to be examined, is measured by using a linewidth measuring device; a vernier method in which gratings of different pitches are printed on an integrated circuit and the portions of the gratings just overlapping are read; a method in which elongated resister and electrode are formed superposedly on an integrated circuit and resistances of the formed resister layers are compared with each other; and a method in which diffraction gratings are printed on an integrated circuit and a deviation of patterns is measured on the basis of a phase difference of diffraction light.

In the method using a pattern linewidth measuring device, however, usually highest precision of only about 0.01 micron is attainable due to the low precision of this type of device. Similarly, with the vernier method, precision is low, about 0.04 micron. With the resistance measurement method, the precision may be high but, on the other hand, it needs complicated processing steps.

The diffraction grating method is effective to solve these problems, and it is inexpensive. In an example of this method, two pairs of diffraction gratings are provided: that is, a first pair of diffraction gratings are formed through a first exposure process and a second pair of diffraction gratings are formed through a second exposure process. Diffraction lights from each pair of diffraction gratings interfere with each other (heterodyne interference), independently of the other pair, and a phase difference between resultant two beat signals is detected. The positional deviation between the diffraction grating pairs is determined on the basis of the detected phase difference.

Figure 1:
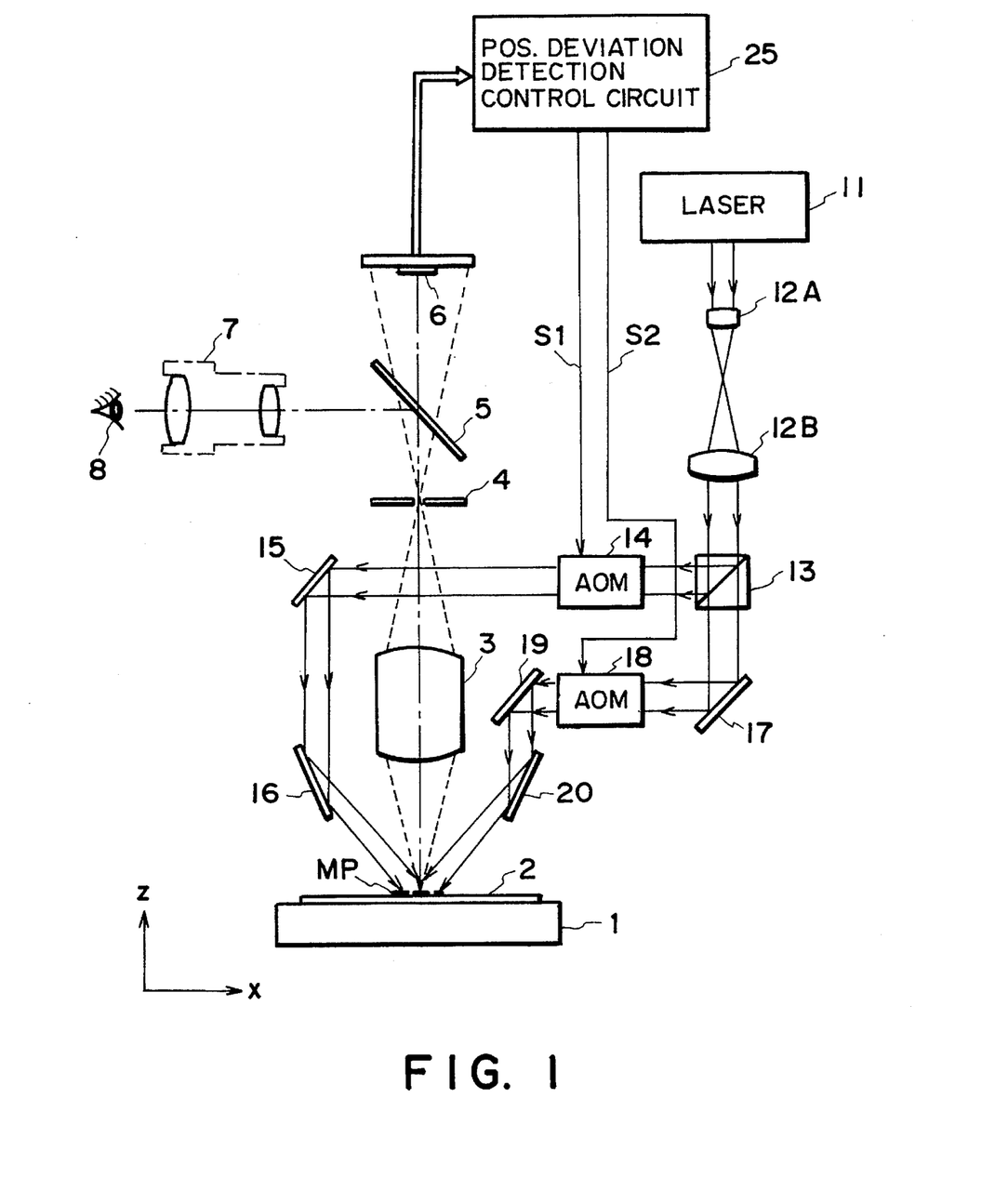
FIG. 1 is a schematic view of a known type positional deviation detecting system.
Figure 2:
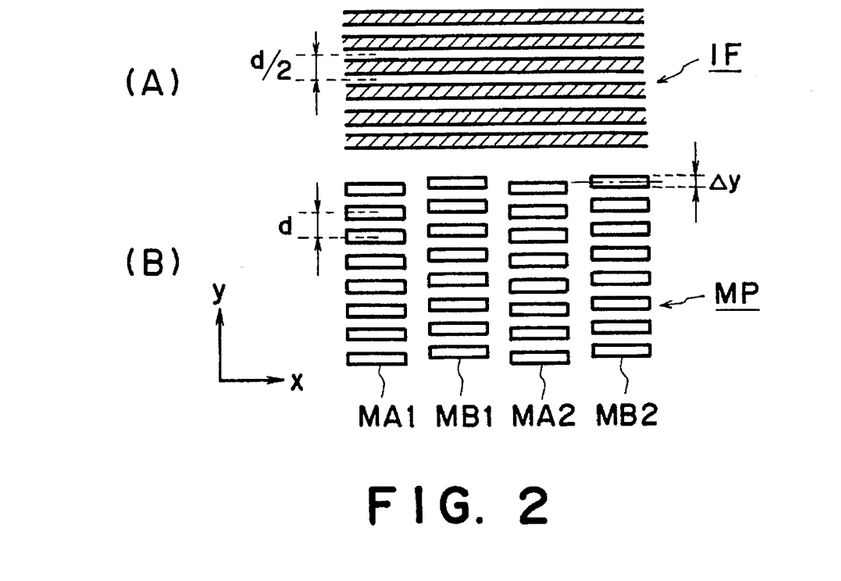
FIG. 2 is a schematic view for explaining diffraction grating pairs in the positional deviation detecting system of FIG. 1 and measurement light used therein.
Figure 3:
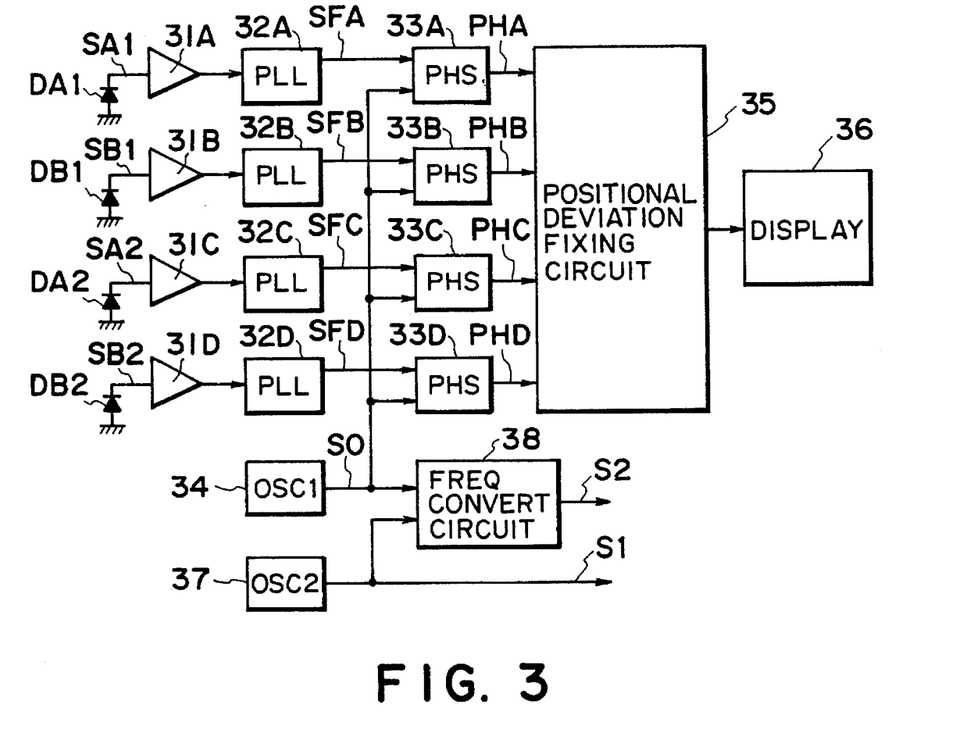
FIG. 3 is a block diagram of a detection controlling circuit of the positional deviation detecting system of FIG. 1.

FIGS. 1, 2 and 3 illustrate a positional deviation measuring system, diffraction gratings provided on a wafer which are going to be detected, and a positional deviation detecting control circuit, respectively, of the type disclosed in Japanese Laid-Open Patent Application, Laid-Open No. 56818/1987.

In FIG. 1, a wafer 2 to be examined is placed on a stage 1. The wafer 2 has been treated twice through exposure process in an exposure apparatus, and finally there are provided positional deviation measuring patterns shown in FIG. 2. First diffraction gratings MA1 and MA2 have a pitch d, and they were printed during the first exposure process, together with a device pattern. Second diffraction gratings MB1 and MB2 have a pitch d, and they were printed during the second exposure process, together with a device pattern. Thus, patterns on the wafer 2 are those having been superposedly printed in this manner, the patterns having been transferred from plural masks or reticles.

In FIG. 1, two coherent light beams having different frequencies are projected onto the diffraction gratings MA1, MA2, MB1 and MB2, along two directions. With these coherent light beams, an interference fringe pattern of pitch d/2 such as depicted at IF in FIG. 2 is produced on the wafer. The projected light beams are diffracted by the diffraction grating groups in the Z direction, whereby heterodyne interference combined diffraction light is produced.

The combined diffraction light is separated by a half mirror 5 into two directions. One of the bisected beams is used for observation at an eyepiece 7, and the other is applied through a photodetector 6 to the positional deviation detecting control circuit as an optical heterodyne interference beat signal.

In the positional deviation detecting control circuit which is shown in FIG. 3, an oscillation circuit 34 produces a reference signal SO which is applied to a phase detector by which the phase differences of phase difference signals SFA—SFD with respect to the reference signal SO are measured. The relative positional deviation ΔY between the two diffraction gratings is then calculated.

The relative positional deviation between diffraction gratings can be detected by measuring a phase difference of measured signals with respect to the reference signal, by using the phase detector. If, however, a diffraction grating group to be measured is rotationally deviated relative to the interference fringe IF shown in FIG. 2, there occurs an optical path difference between coherent light beams having different frequencies, of an amount corresponding to the amount of rotational deviation. Thus, unless the quantity of phase difference attributable to that optical path difference is removed, correct measurement of positional deviation is not attainable. As regards the method of removing such error due to rotational deviation, there is a method which uses a pair of reference gratings for rotational quantity measurement.

More specifically, a diffraction grating group consisting of the diffraction gratings MA1 and MA2 comprises a pair of diffraction gratings with respect to which the positional deviation is already known since they have been formed by transferring patterns of one and the same mask simultaneously. On the other hand, a diffraction grating group consisting of the diffraction gratings MA1 and MB1 which have been formed through different exposure processes are a pair of diffraction gratings with respect to which the positional deviation is unknown.

Here, even with regard to the diffraction grating pair with unknown positional deviation, the positional deviation can be detected correctly by (i) calculating the phase difference quantity resulting from rotational deviation, on the basis of the phase detector output produced in response to measurement to the diffraction grating pair with known positional deviation and (ii) reflecting the calculated phase difference quantity, as an offset, to the phase detector output to be produced in response to measurement to the diffraction grating pair with unknown positional deviation.

Figure 4:
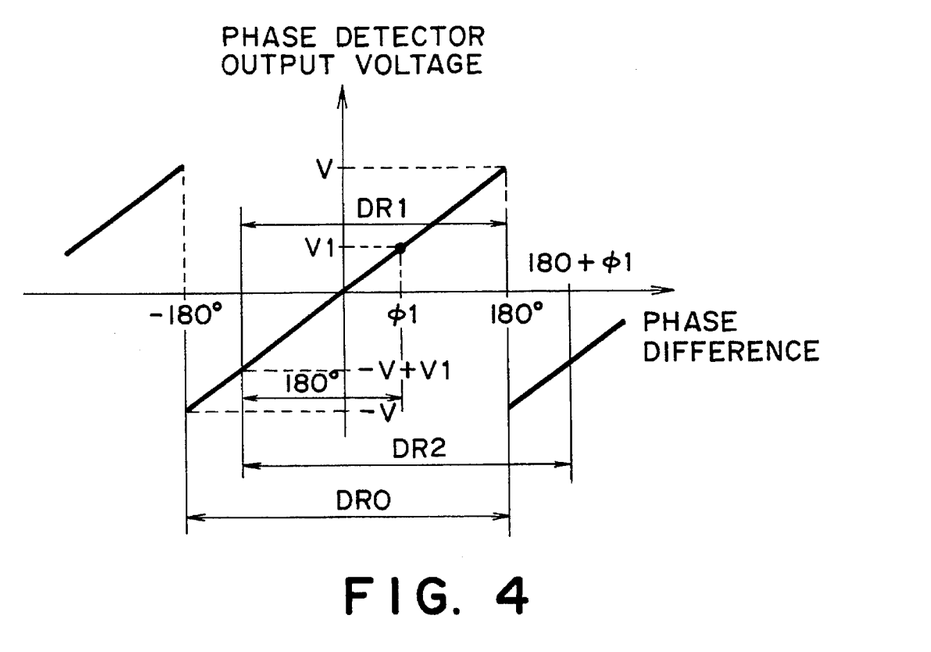
FIG. 4 is a schematic view for explaining a phase difference between a phase signal and a reference signal, as the well as output voltage of a phase detector.

FIG. 4 shows the relationship between the phase and the output of the phase detector. As depicted at DR0, the phase detector has a dynamic range of ±180 deg., and the phase difference can be detected as the output voltage of the phase detector.

Here, In order to retain the dynamic range for measurement to a diffraction grating pair with unknown positional deviation, it is necessary to exclude, as an offset, beforehand the phase difference quantity in the measurement to the diffraction grating pair of unknown positional deviation to thereby prevent the effect of rotational deviation. If, among the diffraction grating pairs of known positional deviation, a diffraction grating pair other than that with no positional deviation is going to be used, a positional deviation corresponding to a design value should be subtracted.

If the phase difference in the measurement to a diffraction grating pair with no positional deviation is denoted by $\phi$ and if the signal processing is done without the removing operation such as described above, the dynamic range for the measurement to a diffraction grating pair with unknown positional deviation is reduced to DR1.

This is because the phase detector output between $-V$ to $-V+V1$ does not correspond to the phase difference of 180 (deg.)+$\phi$1. This problem may be solved by software. If, for example, the measurement result V1 obtained by the measuring a diffraction grating pair with known positional deviation is taken as a reference point, a measurement range DR2 of $\pm 180$ deg. may be retained.

However, a solution relying on software applies a large burden to software development. In actual debugging operation, measurement has to be made to each diffraction grating pair of unknown positional deviation while subtracting the phase difference quantity of a diffraction grating pair of known positional deviation. This requires a complicated procedure.

There are further problems, such as the linearity variation of commercially available phase detectors and difficulties in compensating a change, with time, of the element or elements used in such phase detectors.

Figure 5:
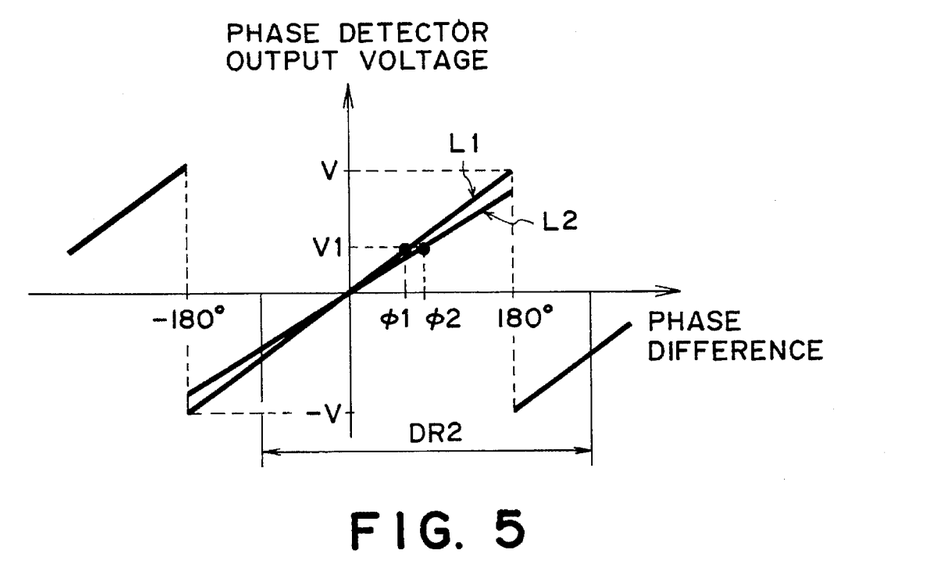
FIG. 5 is a schematic view for explaining the effect of a change in linearity to a measured value.

This is illustrated in FIG. 5. Due to a change with time, for example, the linearity L1 which provides a reference may change to linearity L2. If the phase detector output for measuring a diffraction grating pair with known positional deviation is V1, the reference point in the measurement to a diffraction grating pair with unknown positional deviation changes from $\phi$1 to $\phi$2. In this occasion, without calibration of the phase detector, an error due to the shift of reference point directly causes degradation of the measurement precision to a diffraction grating pair with unknown positional deviation.

SUMMARY OF THE INVENTION

It is an object of the present invention to provide an improved positional deviation measuring system by which at least one of the problems described above can be solved.

It is another object of the present invention to provide a positional deviation measuring system for measuring a positional deviation between diffraction gratings, by which system an error in measurement can be corrected through hardware, whereby a wide dynamic range as well as high measurement precision are achieved.

In accordance with a first aspect of the present invention, there is provided a deviation measuring system for measuring relative positional deviation between first and second diffraction gratings formed on an object, said system comprising: signal detecting means for detecting a signal corresponding to the relative positional deviation between the first and second diffraction gratings, said signal detecting means including (i) projecting means for protecting first and second coherent light beams onto the first and second diffraction gratings, (ii) first photoelectric converting means for photoelectrically converting interference light produced as a result of interference between diffraction light beam of the first coherent light and diffraction light beam of the second coherent light, being diffracted by the first diffraction grating, (iii) second photoelectric converting means for photoelectrically converting interference light produced as a result of interference between diffraction light beam of the first coherent light and diffraction light beam of the second coherent light, being diffracted by the second diffraction grating, (iv) delay means for applying a delay to at least one of output signals of said first and second photoelectric converting means, and (v) signal output means for outputting a signal corresponding to the relative positional deviation, on the basis of said one signal and the other signal; delay determining means for causing said signal detecting means to produce a signal corresponding to a relative positional deviation between third and fourth diffraction gratings formed on the object and having a predetected relative positional deviation, and for determining the amount of the delay to be applied by said delay means; and measuring means for causing said delay means to apply a delay of the amount determined by said delay determining means, and for causing said signal detecting means to produce a signal corresponding to the relative positional deviation between the first and second diffraction gratings, whereby the relative positional deviation is measured on the basis of the produced signal.

In one preferred form of this aspect of the present invention, the signal output means includes signal producing means for producing a signal corresponding to a phase difference between said one signal and the other signal.

In another preferred form of this aspect of the present invention, the first and second coherent light beams of the signal detecting means have different wavelengths.

In a further preferred form of this aspect of the present invention, the delay means includes means for electrically delaying a signal.

In accordance with a second aspect of the present invention, there is provided a method of measuring relative positional deviation between first and second diffraction gratings formed on an object, the method comprising the steps of: detecting, through a signal detecting system, a signal corresponding to the relative positional deviation between the first and second diffraction gratings, wherein the signal detecting system includes (i) an optical system for projecting first and second coherent lights onto the first and second diffraction gratings, (ii) a first photoelectric converting device for photoelectrically converting interference light produced as a result of interference between diffraction light of the first coherent light and diffraction light of the second coherent light, being diffracted by the first diffraction grating, (iii) a second photoelectric converting device for photoelectrically converting interference light produced as a result of interference between diffraction light beam of the first coherent light and diffraction light beam of the second coherent light, being diffracted by the second diffraction grating, (iv) a delay unit for applying a delay to at least one of output signals of the first and second photoelectric converting devices, and (v) a signal output unit for outputting a signal corresponding to the relative positional deviation, on the basis of said one signal and the other signal; determining a delay to be applied by the delay unit, wherein in the delay determining step the signal detecting system Is caused to produce a signal corresponding to a relative positional deviation between third and fourth diffraction gratings formed on the object and having a predetected relative positional deviation, and wherein the amount of the delay to be applied by the delay unit is determined on the basis of the thus produced signal; and measuring the relative positional deviation, wherein in the measuring step the delay unit is caused to apply a delay of the amount determined in the delay determining step, and wherein the signal detecting system is caused to produce a signal corresponding to the relative positional deviation between the first and second diffraction gratings, whereby the relative positional deviation is measured on the basis of the produced signal.

In accordance with a preferred form of this aspect of the present invention, the signal detecting step includes detecting a signal corresponding to a phase difference between said one signal and the other signal.

In accordance with another preferred form of this aspect of the present invention, the first and second coherent light beams have different wavelengths.

In accordance with a further preferred form of this aspect of the present invention, the delay is applied by electrically delaying a signal.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 6:
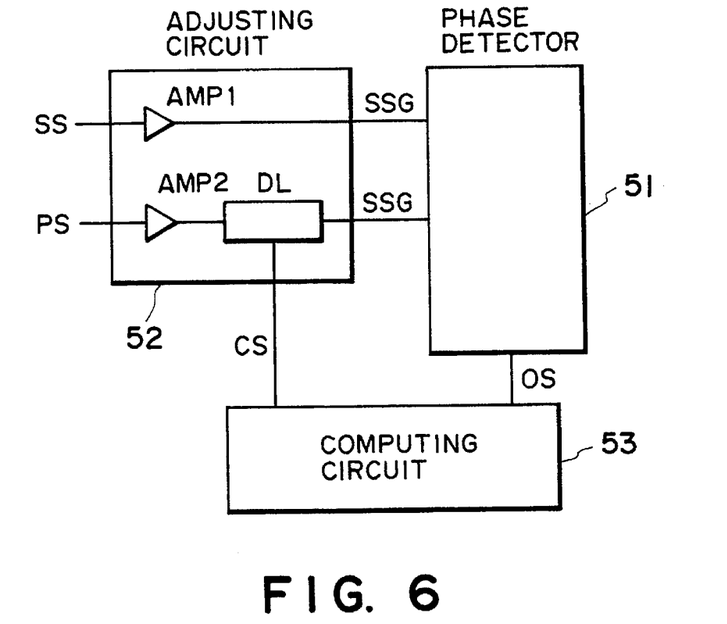
FIG. 6 is a block diagram of a measurement system according to a first embodiment of the present invention.

FIG. 6 is a block diagram of a main portion of a first embodiment of the present invention. The measuring system of this embodiment includes a phase detector 51, an adjusting circuit 52 and a computing circuit 53.

Figure 7:
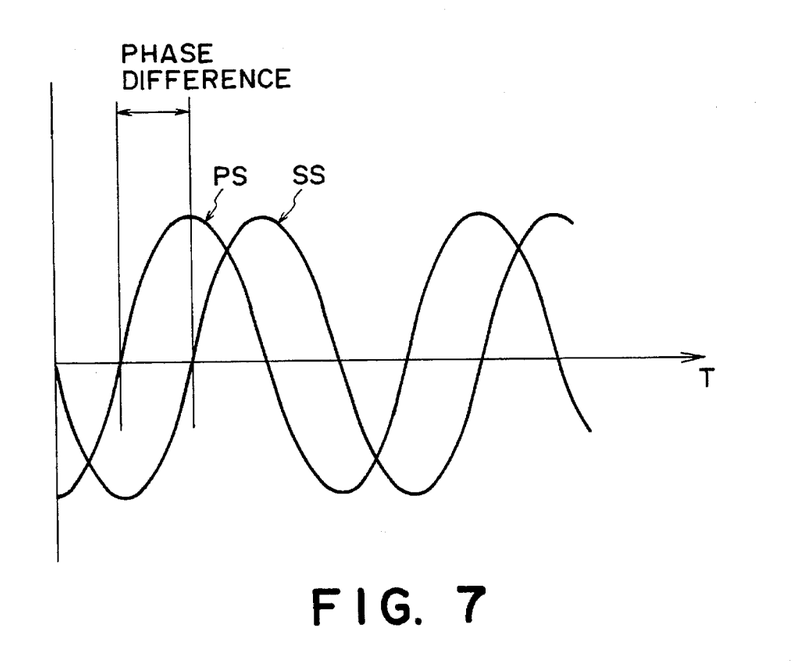
FIG. 7 is a graph for explaining optical heterodyne heat signals.

When two coherent light beams are projected onto a wafer along two directions such as illustrated in FIG. 1, heterodyne interference combined light is produced from diffraction gratings of the wafer. The heterodyne interference combined light to be detected by a photodetector, comprises beat signals, a reference signal SS and a phase signal PS such as shown in FIG. 7. Here, the reference signal SS has different wavelengths consists of an interference signal resulting from diffraction lights from the gratings MA1 and MA2 (FIG. 2), having different wavelengths and having different diffraction orders. The phase signal PS consists of an interference signal resulting from diffraction lights from the gratings MB1 and MB2 (FIG. 2), having different wavelengths and having different diffraction orders.

Referring back to FIG. 6, denoted at AMP1 is an amplifier for a reference signal, and denoted at AMP2 is an amplifier for a phase signal. Denoted at DL is a delay line for controlling a phase signal. Denoted at SSG is an amplified reference signal, being amplified by the amplifier AMP1, and denoted at PSG is an amplified phase signal, being amplified by the amplifier AMP2 and being phase controlled by the delay line DL. Denoted at OS is an output signal from the phase detector 51, and denoted at CS is a control signal for the delay line DL, produced by the computing circuit 53.

The computing circuit 53 serves to read an output signal OS from the phase detector 51 to calculate the amount of positional deviation, and to control the delay line DL. Also, the adjusting circuit 52 serves to amplify a reference signal SS and a phase signal PS, and to adjust the phase of the phase signal PS through the delay line DL.

Figure 8:
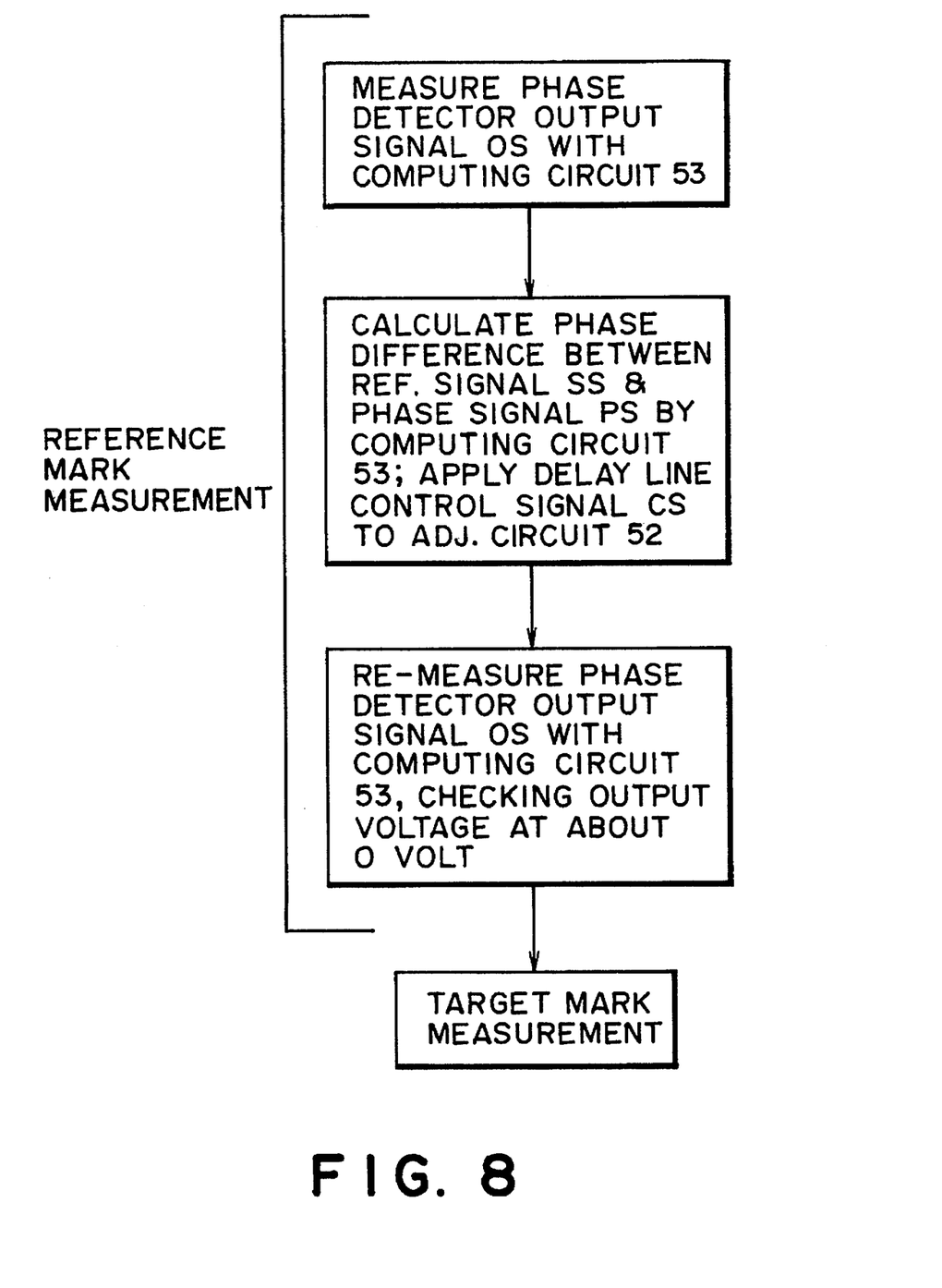
FIG. 8 is a flow chart of a measurement operation of this embodiment.

The measuring system of the above-described structure operates in accordance with the flow chart shown in FIG. 8. What is done first is the measurement to a diffraction grating pair with no positional deviation. Phase difference quantity resulting from rotational deviation of a diffraction grating group can be detected by the phase detector 51 in the form of a phase difference between a reference signal SS and a phase signal PS. Here, the reference signal SS is amplified by the amplifier AMP1, whereby an amplified reference signal SSG is produced which is then applied to the phase detector 51.

Similarly, the phase signal PS is amplified by the amplifier AMP2 and, through the delay line DL, an amplified phase signal PSG is produced which in turn is applied to the phase detector 51.

The phase detector 51 receives the amplified reference reference signal SSG and the amplified phase signal PSG, and it outputs the phase difference quantify between these signals SSG and PSG in a form converted into an output signal OS (DC voltage) from the phase detector 51. The computing circuit receives the phase detector output signal OS, and calculates the phase difference quantity attributable to rotational deviation of the diffraction grating pair with no positional deviation.

On the basis of the thus calculated phase difference quantity, the computing circuit 53 applies a control signal CS to the delay line DL so as to reduce to zero, the phase difference between the reference signal SS and the phase signal PS. In accordance with this control signal CS, the delay line DL serves to shift the phase of the phase signal PS, whereby the phase difference between the reference signal SS and the phase signal PS can be reduced substantially to zero.

Subsequently, measurement is made again. Similarly to the first measurement, heterodyne interference combined light from diffraction gratings of the wafer is measured by the photodetector, and beat signals obtained thereby, which are in the form of a reference signal SS and a phase signal PS, are applied to the adjusting circuit 52. The quantity of phase difference attributable to rotational deviation of the diffraction grating group can be detected by the phase detector 51, as a phase difference between an amplified reference signal SSG and an amplified phase signal PSG including the delay DL determined previously.

The computing circuit 53 then serves to calculate the phase difference quantity, due to the rotational deviation of the diffraction grating group, on the basis of an output signal OS of the phase detector 51. At this time, the computing circuit 53 checks whether, in accordance with the effect of the determined delay line DL, the output signal OS of the phase detector 51 is close to 0 [V], namely, the phase difference between the please signal PS and the reference signal SS is close to zero.

With these operations, preparation for measurement to a diffraction grating pair with unknown phase difference is completed. The center in the phase difference measurement is the origin, i.e., zero, and a wide dynamic range of −180 deg. to 180 deg. is attained.

What is done subsequently is measurement a diffraction grating pair with unknown positional deviation. The amount of delay to be applied by the delay line DL for a phase signal PS in measuring a diffraction grating pair with unknown positional deviation, is determined by holding through the computing circuit 53 the value of the control signal CS obtained during the measurement of the diffraction grating pair with known positional deviation and by fixing that delay amount to the phase signal PS. The phase detector 51 receives an amplitude reference signal SSG and an amplitude phase signal PSG, and it outputs the phase difference quantity between these signals SSG and PSG in the form being converted into an output signal OS (DC signal) from the phase detector 51.

Subsequently, the output signal OS from the phase detector 51 is received by the computing circuit 53 whereby the amount of deviation of the diffraction grating pair with unknown positional deviation is calculated.

As described above, measurement is first made of a diffraction grating pair with no positional deviation and, by operating the delay line DL in accordance with an output signal OS of the phase detector 51, the phase difference quantity attributable to rotational deviation of a diffraction grating group is removed beforehand. By doing so, it becomes possible to execute the deviation measurement of a diffraction grating pair with unknown positional deviation while assuring a wide dynamic range of −180 deg. to 180 deg.

A possible alternative to the structure of FIG. 1 is to invert it so that the delay line DL is incorporated into the signal SS side and so that a signal PS is directly applied to the phase detector 51 from the amplifier AMP2.

In the embodiment described hereinbefore, a diffraction grating pair with no positional deviation is used first. However, in an occasion where positional deviations of diffraction grating pairs with unknown deviations are expected as being distributed about ΔY, a particular diffraction grating pair whose positional deviation ΔY is predetected may be used first: that is, by making an adjustment to reduce the phase difference at that time to zero, measurement may be made subsequently to a diffraction grating pair with unknown deviation, and the sum of a positional deviation corresponding to a measured phase difference with ΔY may be taken as a "measured value".

Figure 9:
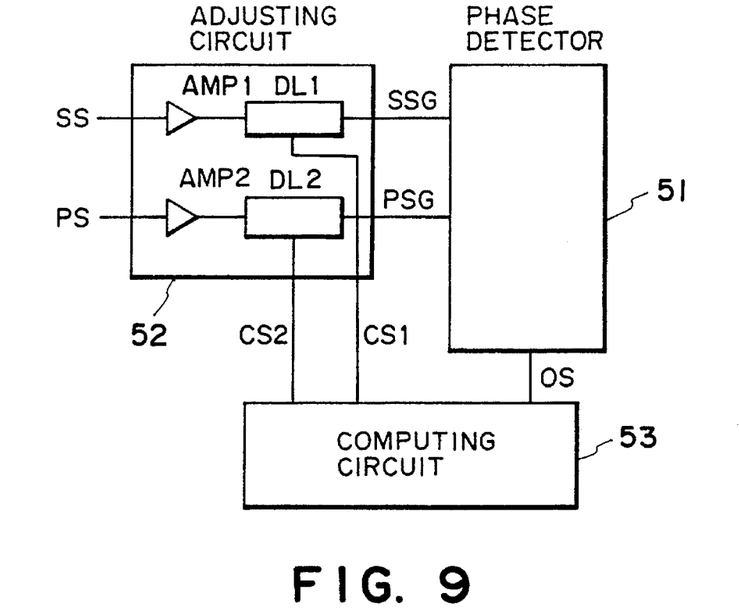
FIG. 9 is a block diagram of a measurement system according to a second embodiment of the present invention.

FIG. 9 is a block diagram of a main portion of a second embodiment of the present invention. The same reference numerals as those of the first embodiment are assigned to corresponding elements. In this embodiment, as an important feature, delay lines DL1 and DL2 are provided for both of the outputs of amplifiers AMP1 and AMP2.

Thus, in this embodiment, the computing circuit 53 is able to control the phase of both of a reference signal SS and a phase signal PS. This means that, while in the first embodiment the delay line DL has to control the phase by 360 deg., in the present embodiment it is sufficient that each delay line DL1 or DL2 controls the phase by 180 deg. Because of this capability of fine adjustment of phase difference quantity, an error due to linearity can be reduced significantly.

Figure 10:
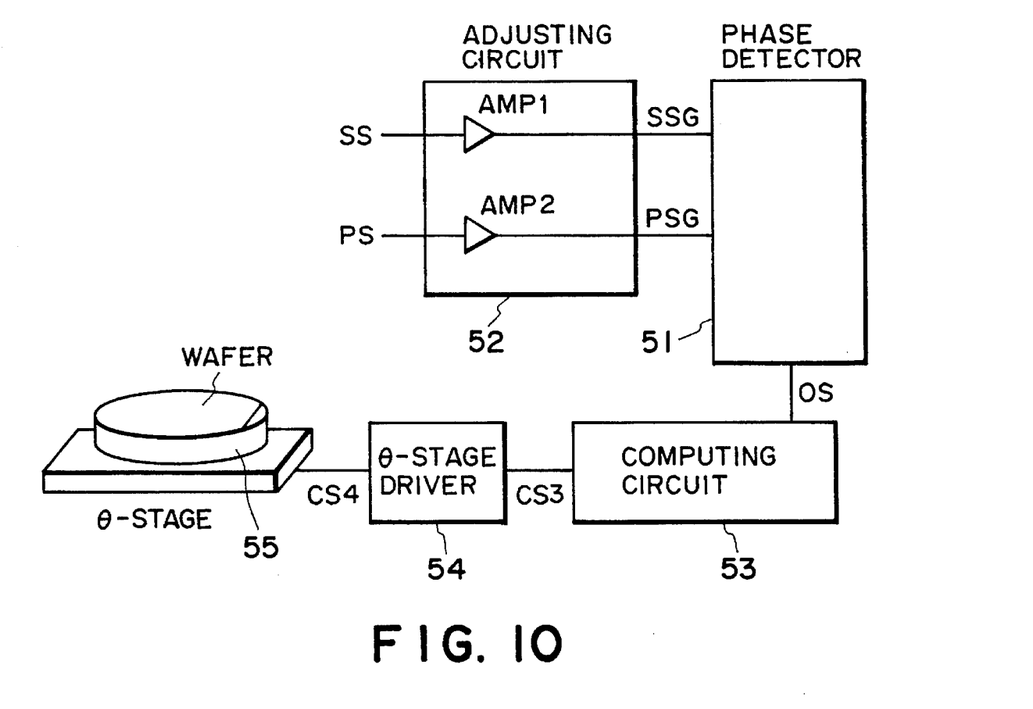
FIG. 10 is a schematic view of a measurement system according to a third embodiment of the present invention.

FIG. 10 is a schematic view of a main portion of a third embodiment of the present invention. The same reference numerals as of those in the first or second embodiment are assigned to corresponding elements.

In this embodiment, in place of using a delay line, the phase difference quantity is removed mechanically. Namely, in response to an output OS of the phase detector 51, the computing circuit 53 rotationally moves a θ stage 55 through a θ stage driver 54 to thereby remove a phase difference quantity in the measurement to a diffraction grating pair with no positional deviation.

In the first and second embodiments, a phase difference quantity due to rotational deviation, in the measurement to a diffraction grating pair with no positional deviation, is electrically removed with the provision of a delay line in the adjusting circuit 52, by which the dynamic range for measuring a diffraction grating pair with unknown positional deviation is retained.

In the present embodiment, as compared therewith, with regard to a diffraction grating pair, with no positional deviation, of a wafer placed on the θ stage 55, the phase difference between a reference signal SS and a phase signal. PS is first detected and the rotational deviation of that diffraction Grating pair is monitored.

Then, on the basis of the detected phase difference quantity, the θ state 55 is rotationally moved to directly and mechanically correct the rotational deviation of the diffraction grating pair. The dynamic range for measuring a diffraction grating pair with unknown positional deviation is assured in this manner. Thus, at this time, the phase difference quantity of the diffraction grating pair with no positional deviation is corrected to zero.

The operation of the measuring system is as follows. First, measurement of a diffraction grating pair with no positional deviation is executed, and the phase difference quantity of the diffraction grating pair attributable to its rotational deviation is detected by the phase detector 51 as a phase difference between a reference signal SS and a phase signal PS. Output signal OS is then applied to the computing circuit 53. On the basis of the output signal OS, the computing circuit 53 calculates the amount of rotational deviation of the diffraction grating pair with no positional deviation, and applies a control signal CS3 to the θ stage driver 54 so as to reduce the rotational deviation of that diffraction grating pair to zero.

In response to the control signal CS3, the θ stage driver 54 rotationally moves the θ stage 55 so as to reduce the rotational deviation of that diffraction grating pair to zero. Here, any deviation in the X-Y coordinates system resulting from the rotational motion of the θ stage 55 is adjusted and corrected in accordance with the amount of rotational motion, and alignment is done. After the rotational motion, re-checking is done similarly to the preceding embodiments, and a deviation attributable to a rotation of the diffraction grating pair with no positional deviation is detected by the phase detector 51 in the form of a phase difference between a reference signal SS and a phase signal In accordance with an output signal OS produced in response by the phase detector 51, the computing circuit 53 detects the phase difference quantity. At this time, it is confirmed by the computing circuit 53 whether the output signal OS from the please detector 51 is close to 0 [V], that is, the phase difference between the phase signal and the reference signal is substantially equal to zero.

After completion of the above-described operations, measurement of a diffraction grating pair with unknown positional deviation is executed.

In this embodiment, it is important to remove an error due to rotational deviation which error is a main factor for precision degradation. Thus, in this embodiment, it is necessary to control so as not to cause rotation of the θ stage 55 in the measurement a diffraction grating pair with unknown positional deviation. To this end, the computing circuit 53 controls a θ stage control signal CS4. As in the preceding embodiments, the phase detector 51 receives an amplified reference signal SSG and an amplified phase signal PSG, and outputs the phase difference quantity between these signals SSG and PSG in the form of an output signal OS (DC signal). Then, the computing circuit 53 receives this output signal OS from the phase detector 51, and calculates the amount of positional deviation of that diffraction grating pair with unknown positional deviation.

It is to be note that the present invention is not limited to heterodyne measurement. Rather, the invention is applicable, for example, also to homodyne measurement wherein a diffraction grating pair may be vibrated during the measurement.

While the invention has been described with reference to the structures disclosed herein, it is not confined to the details set forth and this application is intended to cover such modifications or changes as may come within the purposes of the improvements or the scope of the following claims.

What is claimed is:

1. A deviation measuring system for measuring relative positional deviation between first and second diffraction gratings formed on an object, said system comprising:

signal detecting means for detecting a position deviation signal corresponding to the relative positional deviation between the first and second diffraction gratings, said signal detecting means including (i) projecting means for projecting first and second coherent light beams onto the first and second diffraction gratings, (ii) first photoelectric converting means for photoelectrically converting into a first output signal interference light produced as a result of interference between diffraction light of the first coherent light beam and diffraction light of the second coherent light beam being diffracted by the first diffraction grating, (iii) second photoelectric converting means for photoelectrically converting into a second output signal interference light produced as a result of interference between diffraction light of the first coherent light beam and diffraction light of the second coherent light beam being diffracted by the second diffraction grating, (iv) delay means for applying a delay to at least one of said first and second output signals of said first and second photoelectric converting means, and (v) position deviation signal output means for outputting a position deviation signal corresponding to a relative positional deviation on the basis of said at least one output signal delayed by said delay means and the other output signal;

compensation delay determining means for causing said signal detecting means to produce a position deviation signal corresponding to a relative positional deviation between third and fourth diffraction gratings formed on the object and having a predetected relative positional deviation, and for determining a compensation amount of delay to be applied by said delay means; and measuring means for causing said delay means to apply a compensation amount of delay determined by said compensation delay determining means, and for causing said signal detecting means to produce a positional deviation signal corresponding to the relative positional deviation between the first and second diffraction gratings on the basis of the position deviation signal produced by said signal detecting means in accordance with the compensation amount of delay determined by said compensation delay determining means.

2. A system according to claim 1, wherein said signal output means includes phase difference signal producing means for producing a phase difference signal corresponding to a phase difference between said one respective output signal and the other respective output signal.

3. A system according to claim 2, wherein the first and second coherent light beams of said signal detecting means have different wavelengths.

4. A system according to claim 1, wherein said delay means includes means for electrically delaying a signal.

5. A method of measuring relative positional deviation between first and second diffraction gratings formed on an object, said method comprising the steps of:

detecting, through a signal detecting system, a position deviation signal corresponding to the relative positional deviation between the first and second diffraction gratings, wherein the signal detecting system includes (i) an optical system for projecting first and second coherent light beams onto the first and second diffraction gratings, (ii) a first photoelectric converting device for photoelectrically converting into a first output signal interference light produced as a result of interference between diffraction light of the first coherent light beam and diffraction light of the second coherent light beam being diffracted by the first diffraction grating, (iii) a second photoelectric converting device for photoelectrically converting into a second output signal interference light produced as a result of interference between diffraction light of the first coherent light beam and diffraction light of the second coherent light beam being diffracted by the second diffraction grating, (iv) a delay unit for applying a delay to at least one of said first and second output signals of said first and second photoelectric converting devices, and (v) a position deviation signal output unit for outputting a position deviation signal corresponding to the relative positional deviation on the basis of said at least one output signal delayed by said delay means and the other output signal;

determining a compensation amount of delay to be applied by the delay unit, wherein the signal detecting system is caused to produced a position deviation signal corresponding to a relative positional deviation between third and fourth diffraction gratings formed on the object and having a predetermined relative positional deviation, and wherein the compensation amount of delay to be applied by the delay unit is determined on the basis of the position deviation signal; and measuring the relative positional deviation, wherein the delay unit is caused to apply a compensation amount of delay determined in said compensation delay determining step, and wherein the signal detecting system is caused to produce a position deviation signal corresponding to the relative positional deviation between the first and second diffraction gratings on the basis of the position deviation signal produced by said signal detecting means in accordance with the compensation amount of delay determined in the compensation delay determining step.

6. A method according to claim 5, wherein said signal detecting step includes detecting a phase difference signal corresponding to a phase difference between said at least one output signal and the other output signal.

7. A method according to claim 6, wherein the first and second coherent light beams have different wavelengths.

8. A method according to claim 5, wherein the delay is applied by electrically delaying a signal.

* * * * *

UNITED STATES PATENT AND TRADEMARK OFFICE
CERTIFICATE OF CORRECTION

PATENT NO. : 5,498,878
DATED : March 12, 1996
INVENTOR(S) : NORIYASU HASEGAWA, et al.

It is certified that error appears in the above-indentified patent and that said Letters Patent is hereby corrected as shown below:

ON THE TITLE PAGE:

Attorney, Agent, or Firm;

"Fitzpatrick, Cella Harper & Scinto" should read --Fitzpatrick, Cella, Harper & Scinto--.

[57] IN THE ABSTRACT

Line 11, "grating" should read --gratings--.

COLUMN 2

Line 65, "In" should read --in--.

COLUMN 3

Line 18, "by the" should read --by--.

COLUMN 4

Line 29, "said" should be deleted.
Line 60, "said" should be deleted.
Line 62, "Is" should read --is--.

UNITED STATES PATENT AND TRADEMARK OFFICE
CERTIFICATE OF CORRECTION

PATENT NO. : 5,498,878
DATED : March 12, 1996
INVENTOR(S) : NORIYASU HASEGAWA, et al.

It is certified that error appears in the above-indentified patent and that said Letters Patent is hereby corrected as shown below:

COLUMN 5

Line 12, "said" should be deleted.
    Line 36, "as the" should read --as--.
    Line 63, "photodetector," should read --photodetector--.

COLUMN 6

Line 37, "reference" should be deleted.

COLUMN 7

Line 6, "please" should read --phase--.
    Line 13, "measurement" should read --measuring--.

COLUMN 8

Line 28, "Grating" should read --grating--.

UNITED STATES PATENT AND TRADEMARK OFFICE
CERTIFICATE OF CORRECTION

PATENT NO. : 5,498,878
DATED : March 12, 1996
INVENTOR(S) : NORIYASU HASEGAWA, et al.

It is certified that error appears in the above-indentified patent and that said Letters Patent is hereby corrected as shown below:

COLUMN 9

Line 21, "note" should read --noted--.

Signed and Sealed this

Ninth Day of July, 1996

Attest:

BRUCE LEHMAN

Attesting Officer    Commissioner of Patents and Trademarks